United States Patent
Somaiya (10) Patent No.: US 9,684,474 B2
(45) Date of Patent: Jun. 20, 2017

(54) SINGLE INPUT/OUTPUT CELL WITH MULTIPLE BOND PADS AND/OR TRANSMITTERS

(71) Applicant: SanDisk Technologies Inc., Plano, TX (US)

(72) Inventor: Vikram Somaiya, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 662 days.

(21) Appl. No.: 14/191,097

(22) Filed: Feb. 26, 2014

(65) Prior Publication Data

US 2015/0134918 A1   May 14, 2015

(30) Foreign Application Priority Data

Nov. 12, 2013 (IN) .......................... 5121/CHE/2013

(51) Int. Cl.
*G06F 3/06* (2006.01)
*G11C 16/24* (2006.01)
*G06F 13/16* (2006.01)

(52) U.S. Cl.
CPC .......... *G06F 3/0659* (2013.01); *G06F 3/0604* (2013.01); *G06F 3/0673* (2013.01); *G06F 13/1668* (2013.01); *G11C 16/24* (2013.01); *G06F 2003/0697* (2013.01); *G11C 2207/105* (2013.01)

(58) Field of Classification Search
CPC .... G11C 7/18; G11C 106/24; G11C 2207/105
See application file for complete search history.

(56) References Cited

U.S. PATENT DOCUMENTS

| | | |
|---|---|---|
| 5,506,499 A | 4/1996 | Puar |
| 5,986,957 A | 11/1999 | Ishii |
| 6,320,757 B1 | 11/2001 | Liu |
| 6,580,164 B1 | 6/2003 | Ohie |
| 6,586,823 B2 | 7/2003 | Ohmura et al. |
| 6,791,127 B2 | 9/2004 | Nunokawa |
| 6,807,109 B2 | 10/2004 | Tomishima |
| 6,882,171 B2 | 4/2005 | Ong |
| 6,891,275 B2 | 5/2005 | Lane et al. |
| 7,081,899 B2 | 7/2006 | Shimazaki et al. |
| 7,489,023 B2 | 2/2009 | Pape |

(Continued)

FOREIGN PATENT DOCUMENTS

WO   WO 2010/029480 A2   3/2010

OTHER PUBLICATIONS

International Search Report and Written Opinion for corresponding PCT Application No. PCT/US2014/064064 mailed Mar. 13, 2015.

*Primary Examiner* — Glenn A Auve
(74) *Attorney, Agent, or Firm* — Brinks Gilson & Lione (57) ABSTRACT

A storage module may include a controller configured to communicate with a memory having a plurality of memory dies. The controller may include a plurality of bond pads, where each bond pad is configured to communicate a same type of memory signal, and where each bond pad is electrically connected to at least one but less than all of the plurality of memory dies. A core of the controller may identify a memory die that it wants to communicate a memory signal and an associated bond pad with which to communicate the memory signal.

21 Claims, 5 Drawing Sheets

(56) References Cited

U.S. PATENT DOCUMENTS

| | | |
|---|---|---|
| 7,541,680 B2 | 6/2009 | Kwon et al. |
| 7,579,683 B1 | 8/2009 | Falik et al. |
| 7,598,606 B2 | 10/2009 | Chow et al. |
| 7,608,925 B2 | 10/2009 | Takinomi |
| 7,664,895 B2 | 2/2010 | Nonoyama et al. |
| 2002/0121679 A1 | 9/2002 | Bazarjani et al. |
| 2008/0159011 A1 | 7/2008 | Kurihara et al. |
| 2012/0201068 A1* | 8/2012 | Ware .................. G11C 5/04 365/63 |
| 2012/0215958 A1 | 8/2012 | Fai et al. |
| 2013/0083614 A1 | 4/2013 | Yoo et al. |
| 2013/0094301 A1* | 4/2013 | Min .................. H01L 23/48 365/189.02 |
| 2013/0148401 A1* | 6/2013 | Fai .................. G11C 5/063 365/63 |
| 2013/0242664 A1 | 9/2013 | Shimizu et al. |

\* cited by examiner

SINGLE INPUT/OUTPUT CELL WITH MULTIPLE BOND PADS AND/OR TRANSMITTERS

CROSS-REFERENCE TO RELATED APPLICATIONS

This application claims priority to Indian Patent Application No. 5121/CHE/2013, filed Nov. 12, 2013. The contents of Indian Patent Application No. 5121/CHE/2013 are incorporated by reference in their entirety.

BACKGROUND

Storage modules may manage data storage in memory in response to host commands received from a host. To store data and read stored data in the memory, an external controller may communicate data, commands, or other information to memory dies. Bond pads or pins may be used for external routing between the external controller and the memory dies.

SUMMARY

In a first aspect, an electronic device includes a first circuit that has a plurality of first circuit bond pads configured to communicate a same type of signal; and a second circuit that includes a plurality of second circuit bond pads configured to communicate the same type of signal with the plurality of first bond pads of the first circuit. Each of the first circuit bond pads are electrically connected to at least one and less than all of the plurality of second circuit bond pads.

In a second aspect, a method may include determining, with a core of a first circuit, to communicate a signal with a second circuit, the signal being a predetermined type; identifying, with the core, a first area from among a plurality of areas of the second circuit with which to communicate the signal; and identifying, with the core, an associated first circuit bond pad from among a plurality of first circuit bond pads of the first circuit with which to communicate the signal. The plurality of first circuit bond pads may be configured to communicate signals being the predetermined type with the plurality of areas of the second circuit. In addition, each of the plurality of first circuit bond pads may be electrically connected to at least one and less than all of the plurality of areas. Further, the associated first circuit bond pad may be electrically connected to the first area. The method may further include communicating the signal between the core and the first area via the associated first circuit bond pad.

In a third aspect, a storage module may include a controller configured to communicate with a memory comprising a plurality of memory dies. The controller may include: a plurality of controller bond pads configured to communicate a same type of memory signal with a plurality of die bond pads of the plurality of memory dies. Each of the plurality of controller bond pads may be electrically connected to at least one and less than all of the plurality of die bond pads. The controller may further include a core configured to: determine to communicate a memory signal with the memory, where the memory signal is the same type; identify a controller bond pad from among the plurality of controller bond pads via which to communicate the memory signal with the memory; and communicate the memory signal with the identified controller bond pad.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Various modifications to and equivalents of the embodiments described and shown are possible and various generic principles defined herein may be applied to these and other embodiments. Thus, the claimed invention is to be accorded the widest scope consistent with the principles, features, and teachings disclosed herein.

Figure 1:
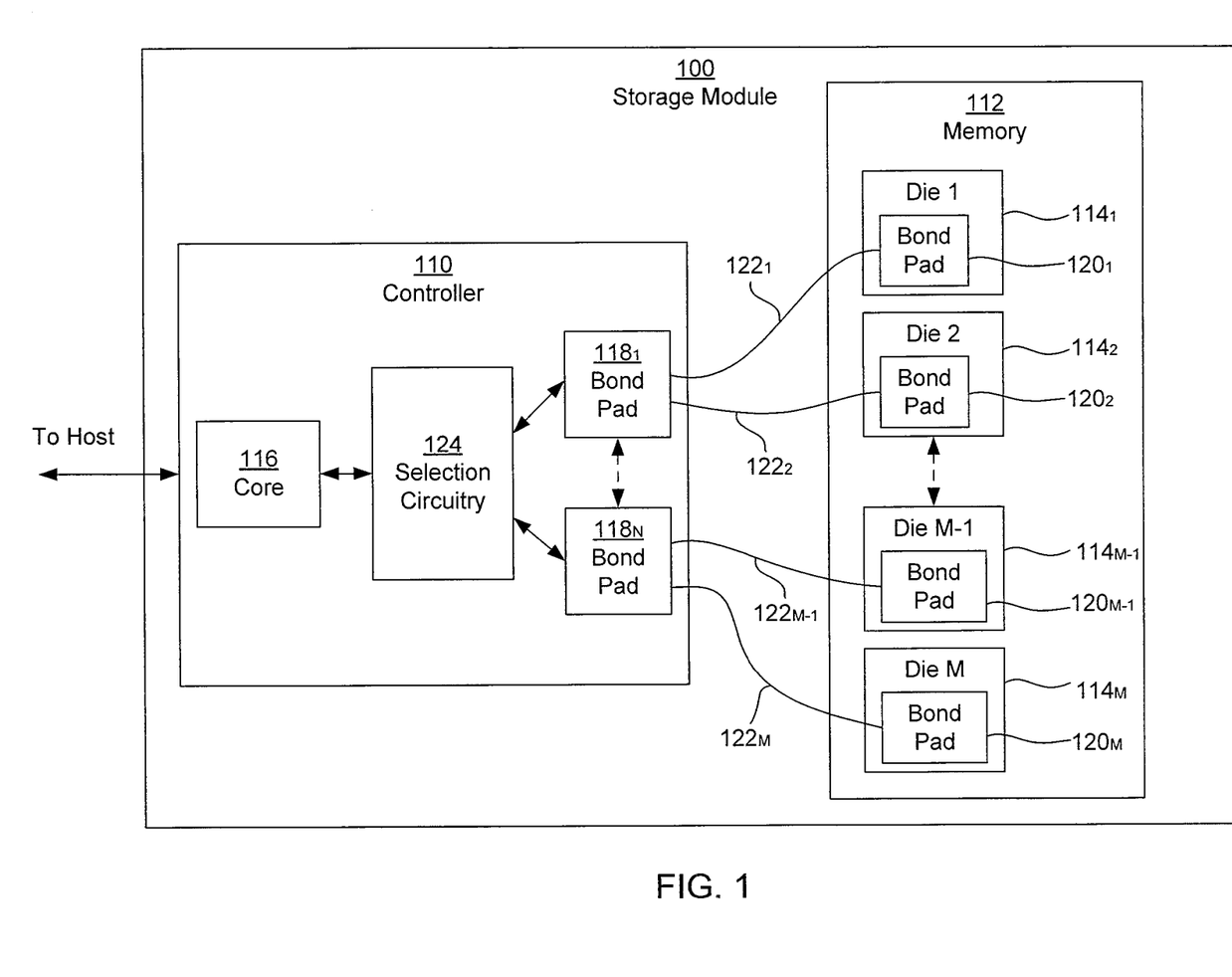
FIG. 1 is a block diagram of an example storage module.

The present description describes a storage module that includes a controller component and a memory component, where one of the components uses a plurality of bond pads to communicate signals of a same type to the other component. FIG. 1 shows a block diagram of an example embodiment of a storage module 100 that includes a controller 110 and a memory 112. The controller 110 may be configured to control and manage storage of data in the storage module 100. In addition, the storage controller 110 may communicate with a host or host device (not shown in FIG. 1). For example, the controller 110 may receive host commands, such as read and write commands, from the host, and communicate responses to the host commands to the host. The storage module controller 110 may also communicate with the memory 112 to store and/or control the storage of the data.

The memory 112 may be configured to store the data or other information. Example memory 112 may be non-volatile memory, such as flash memory (e.g., NAND-type flash memory or NOR-type flash memory), read-only memory, ferroelectric RAM (F-RAM), other types of non-volatile memory, either currently existing or later developed, or combinations thereof. The memory 112 may be divided or separated into an M-number of different memory (e.g., silicon) dies $114_1$ to $114_M$. An example number of dies may be eight, although other numbers two or greater may be used.

The controller 110 may include a core 116 that is configured to perform the functions or operations of the controller 110. The core 116 may be implemented in hardware or some combination of hardware and software. Example hardware and/or software components of the core 116 may include a processor or processing circuitry, logic circuitry, internal memory, software and/or firmware stored in the internal memory and/or executable by the processing circuitry, and/or combinations thereof. The core 116 and/or the components of the core 116 may be integrated as an integrated circuit or chip for some example configurations.

The functions or operations of the controller 110 may include communicating, including sending and receiving, signals that contain data, commands, or other information to the dies $114_1$ to $114_M$ of the memory 112 to store data, retrieve data, and/or manage or control the storage or retrieval of data in the dies $114_1$ to $114_M$. At least some of the signals may be generated and/or communicated by the core 116 in response to receipt of host commands, such as read or write host commands.

In addition, the signals that are communicated may be of various or different types. Example types may include data signals (including multiple or different bits of data), clock signals, write strobe signals, read strobe signals, chip enable signals, address latch enable signals, or command latch enable signals, as examples. Other types of signals communicated by the core 116 to dies $114_1$ to $114_M$ of the memory 112 to control and/or manage the storage and retrieval of data may be possible. The memory signals of different types may be different because they are used by the controller 110, the memory 112, or other components of the storage module 100 to perform different functions or operations. In addition or alternatively, signals may be considered to have different types based on their characteristics, such as whether they are differential signals, pseudo differential signals, or single-ended signals, and/or whether the signals are in different voltage domains, as examples. Hereafter, unless otherwise specified, these different types of signals may be collectively referred to as memory signals.

Due to physical constraints, the core 116 may be unable to directly communicate memory signals with the different memory dies 114. In order to communicate the memory signals, the controller 110 may include controller bond pads 118 and the memory dies 114 may include die bond pads 120 (bond pads may be otherwise or interchangeably referred to as bond openings or pins). The controller bond pads 118 and the die bond pads 120 may be electrically connected to each other with wires 122, such as bond wires or other elongate conductive structures suitable for electrically connecting or coupling a pair of bond pads.

In some example embodiments, the controller 110 may be configured to have a single controller bond pad configuration. Under the single controller bond pad configuration, the controller 110 may have a single controller bond pad 118 for each of the different memory signals that the controller 110 communicates to the dies $114_1$ to $114_M$. As an example, if the controller 110 is configured to communicate ten different types of memory signals to the dies $114_1$ to $114_M$, then under the single controller bond pad configuration, the controller 110 may have ten controller bond pads 118 to communicate the ten different types of memory signals—one designated for each type. Correspondingly, each of the dies $114_1$ to $114_M$ may have a die bond pad 120 for each of the different types of memory signals being communicated. In this way, under the single controller bond pad configuration, the number of controller bond pads 118 and the number of bond die pads 120 on each die $114_1$ to $114_M$ is the same. Further, the controller bond pads 118 and the die bond pads 120 that are configured to communicate memory signals of the same type are electrically connected together via the wires 122.

Instead of the single controller bond pad configuration, the controller 110 shown in FIG. 1 has a multiple controller bond pad configuration, where the controller 110 includes an N-number of controller bond pads 120 for communication of a single type of memory signal between the controller 110 and the memory dies $114_1$ to $114_M$, where N is two or greater. For simplicity, hereafter unless otherwise specified, the present description and the referenced drawings describe and show the multiple controller bond pad configuration for only a single type of memory signal being communicated between the controller 110 and the memory dies $114_1$ to $114_M$.

FIG. 1 shows the controller 110 including an N-number of controller bond pads $118_1$ to $118_N$ in electrical connection with an M-number of bond pads $120_1$ to $120_M$ included on the M-number of memory dies $114_1$ to $114_M$. Additionally, as shown in FIG. 1, an M-number of wires $122_1$ to $122_M$ electrically connect the N-number of controller bond pads 118 with the M-number of die bond pads 120.

The electrical connections between the N-number of controller bond pads 118 and the M-number of die bond pads 120 may have a predetermined arrangement or configuration. In particular, the M-number of dies 114 may be arranged or configured into an N-number of groups, with each group being associated and/or electrically connected with one of the N-number of controller bond pads 118 of the controller 110. The numbers of dies 114 in the groups may be the same or different from each other. Each of the wires 122 may electrically connect one of the controller bond pads 118 with one of the die bond pads 120 in the group with which the controller bond pad 118 is associated. In this way, each of the N-number of controller bond pads 118 is electrically connected to at least one but less than all of the M-number of die bond pads 120.

As an example illustration, suppose the memory 112 includes eight memory dies 114 and the controller 110 includes two bond pads 118 (i.e., M=8 and N=2). In addition, suppose the eight memory dies 114 are divided into two groups, a first group and a second group, with each group including four of the dies 114. For example, suppose the first group includes Die 1, Die 2, Die 3, Die 4, and the second group includes Die 5, Die 6, Die 7, Die 8. Further, suppose the first group of dies 114 is associated with a first controller bond pad $118_1$, and the second group is associated with a second controller bond pad $118_2$. Under this arrangement or configuration, a first set of the wires $122_1$ to $122_4$ may electrically connect the first controller bond pad $118_1$ with the die bond pads $120_1$ to $120_4$ in the first group, and a second set of the wires $122_5$ to $122_8$ may electrically connect the second controller $118_2$ with the die bond pads $120_5$ to $120_8$ in the second group.

Each association of a controller bond pad 118 and one or more die bond pads 120 in a group that are associated and/or electrically connected with the controller bond 118 may have an associated bond pad capacitance with respect to ground or ground reference (not shown). Each associated bond pad capacitance may include a controller bond pad capacitance generated between the controller bond pad 118 and ground, a die bond pad capacitance generated between the die bond pads 120 in the associated group and ground, and wire capacitance generated between the wires 122 that electrically connect the controller bond pad 118 and the die bond pads 120 in the associated group. Because the wires 122 connect the die bond pads 120 in a group with the same bond pad 118, the controller bond pad, die bond pad, and wire capacitances are electrically connected in parallel with each other. As such, the associated bond pad capacitance, generated between the bond pad 118 and die bond pads 120 in an associated group is the sum of the controller bond pad capacitance, die bond pad capacitance, and wire capacitance.

The memory signals may be communicated over the wires 122 between the controller bond pads 118 and the die bond pads 120 as signals having voltage levels corresponding to logic "high" and logic "low." Power that is consumed to communicate the memory signals is proportional to $\frac{1}{2}CV^2$, where C is the associated bond pad capacitance and V is the voltage of the signals. During a period of time, the more times that a signal oscillates or toggles between logic "high" and logic "low" voltage levels, the more power is consumed. The voltage levels at which signals are generated are typically fixed, and so in order to reduce power consumption over a period of time, the number of times that the signals toggle or oscillate (i.e., the operating frequency) and/or the bond pad capacitance must be reduced.

The associated bond pad capacitances generated between the N-number of controller bond pads 118 and the M-number of die bond pads 120 for the configuration of the controller 110 shown in FIG. 1 may be less compared to alternative configurations where the controller 110 includes only a single controller bond pad 118 (i.e., N=1) but the M-number of dies 114 and die bond pads 120 remains the same. For example, using the illustration above where the memory 112 includes eight dies 114 (i.e., M=8), if the controller 110 includes only a single bond pad 118, then all eight of the die bond pads 120 may be electrically connected to the same, single controller bond pad 118. Accordingly, the bond pad capacitance associated with the single controller bond pad 118 includes the sum of all eight of the die bond pad capacitances associated with the eight die bond pads 120. In contrast, when multiple controller bond pads 118 are used, the bond pad capacitance may be reduced because the number of die bond pads with which each controller bond pad 118 is electrically connected is reduced. For example, using the above illustration, where two controller bond pads 118 are used and each one is electrically connected to four of the eight die bond pads 120, the bond pad capacitance associated with each of the controller bond pads 118 is less compared to the single controller bond pad configuration because each controller bond pad 118 is connected to only four die bond pads instead of all eight.

The controller 110 may further include selection circuitry 124 in communication with the core 116 and the controller bond pads 118. For some example configurations, the selection circuitry 124 in combination with the controller bond pads 118 may be referred to as a PAD cell or a PAD macro. The selection circuitry 124 may be configured to selectively communicate the memory signals output from the core 116 to the controller bond pad 118 associated and/or electrically connected with the die bond pad 118 with which the core 116 wants to communicate the memory signal.

To illustrate using the above example, suppose that to execute a host write command, data is to be written to a first memory $114_1$. In the illustration, because the first memory die $114_1$ is part of the first group that is connected to the first controller bond pad $118_1$, the selection circuitry 124 may be configured to selectively communicate the data to be written to the first memory die $114_1$ to the first controller bond pad $118_1$ but not to the second controller bond pad $118_2$.

Additionally, as described in more detail below, the selection circuitry 124 may be configured to change the logic voltage levels of the signals being communicated between the memory 112 and the core 116, as appropriate. In particular, for some example configurations of the storage module 100, the controller 110 (including the core 116) may be configured to operate at different logic voltage levels than the memory 112. An example logic "high" voltage level for the core 116 may be 1.0 volts and a logic "high" voltage level for the memory 112 may be 1.8 volts or 3.3 volts. For these configurations, the selection circuitry 124 may be configured to change the logic voltage levels.

The core 116 may be configured to determine which of the controller bond pads 118 it wants and does not want to communicate memory signals with. In particular, when the core 116 determines it wants to communicate a memory signal with the memory 112, which may include sending a memory signal to one of the dies $114_1$ to $114_N$ or receiving a memory signal from one of the dies $114_1$ to $114_N$, the core 116 may be configured to identify the memory die 114 with which to communicate the memory signal. The core 116 may then be configured to determine a controller bond pad 118 with which the identified die 114 is associated and/or electrically connected. The core 116 may determine the associated controller bond pad 118 in various ways, such as through use of mapping, decoding, or by performing a table lookup in a table that associates the controller bond pads 118 and the memory dies 114.

In addition, the core 116 may be configured to control the selective communication of the selection circuitry 124 so that the associated controller bond pad 118 receives the memory signal being communicated while the one or more other controller bond pads 118 that are unassociated with the identified die 114 do not receive the memory signal, as desired by the core 116. The core 116 may be configured to control the selective communication by generating and/or sending one or more control signals to the selection circuitry 124, which may configure the selection circuitry 124 in a desired or predetermined state. In the desired or predetermined state, the switching circuitry 124 may electrically connect or couple the associated controller bond pad 118 with the core 116, while electrically disconnecting or decoupling the one or more other unassociated controller bond pads 118 from the controller 116, as desired by the core 116. Accordingly, when the selection circuitry 124 is in the predetermined state and receives a memory signal from the core 116, the selection circuitry 124 sends the memory signal to the controller bonding pad 118 associated with the identified die 114 but not to the one or more other unassociated controller bond pads 118. In turn, the memory signal may be communicated from the associated controller bond pad 118 to a die bond pad 120 of the identified memory die 114. Similarly, when the selection circuitry 124 is in the predetermined state and receives a memory signal communicated from the identified memory die 114 via the associated controller bond pad 118, the selection circuitry 124 may communicate the memory signal to the core 116. The core 116 may generate the control signals based on chip enable signals or other relevant signals upon determining which of the dies 114 to communicate the memory signal.

In addition, as described in further detail below, the control signals may configure the selection circuitry 124 to place and/or maintain the other controller bond pads 118 not associated with the identified die 114 in a steady-state, such as by applying a steady-state voltage level (e.g., logic "high" voltage or a logic "low" voltage), or configuring the other controller bond pads 118 in a floating or high-impedance state. Placing the other controller bond pads 118 not associated with the identified die 114 in a steady state may prevent or discourage the voltage levels at the other controller bond pads 118 from toggling between logic voltage levels as the memory signals are communicated between the associated controller bond pad 118 and the die bond pads 120 in the associated group.

Figure 2:
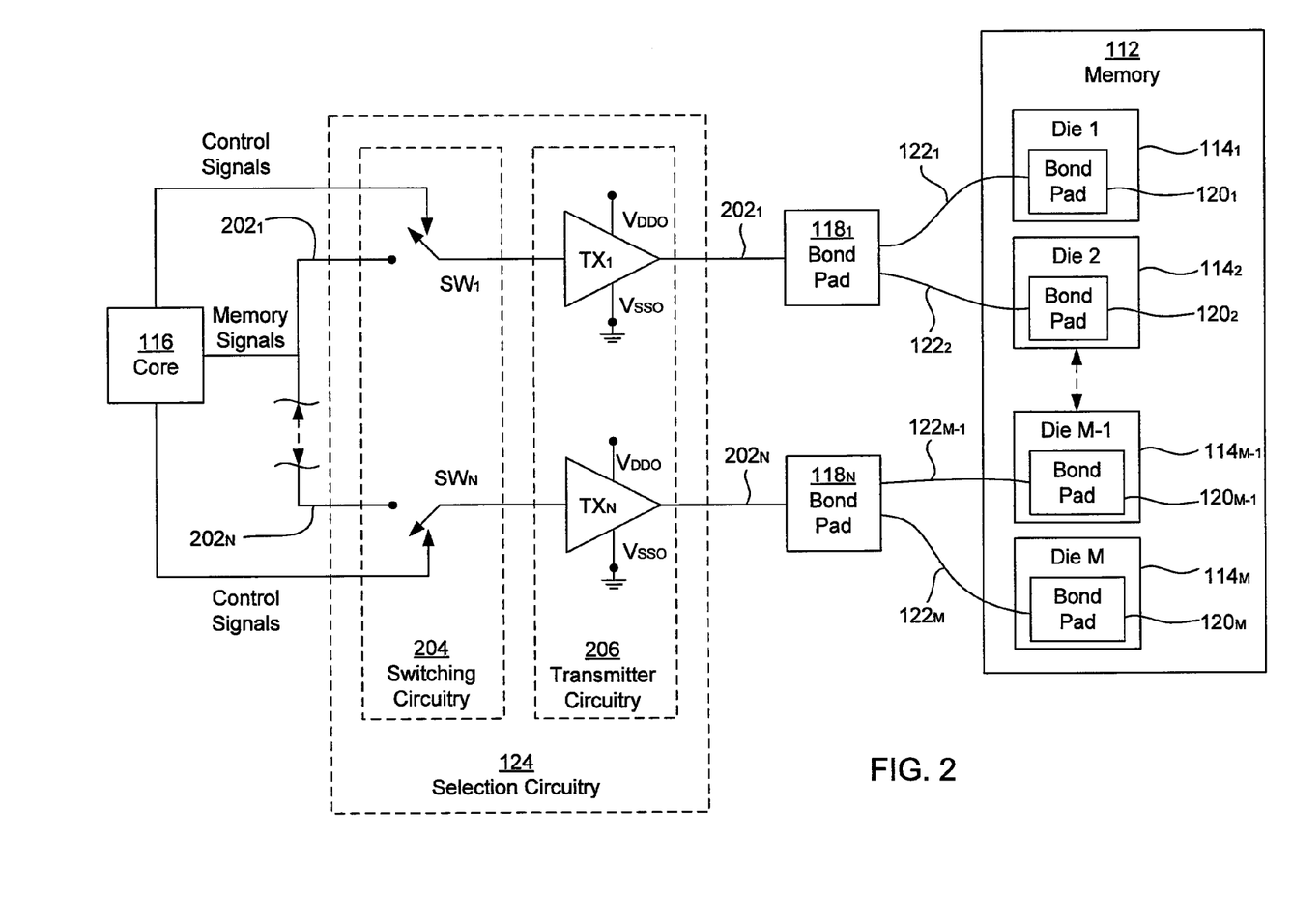
FIG. 2 is a block diagram of the example storage module of FIG. 1, showing an example configuration of selection circuitry.

FIG. 2 shows a circuit schematic diagram of an example configuration of the selection circuitry 124 in communication with the core 116 and the N-number of controller bond pads 118. The selection circuitry 124 may include an N-number of paths 202, with each path in electrical communication and/or coupled with one of the N-number of controller bond pads 118. Each path may be configured to communicate memory signals between the core 116 and the controller bond pad 118 with which it is in communication.

The selection circuitry 124 may also include switching circuitry 204 integrated with the N-number of paths 202. The switching circuitry 204 may be configured to electrically connect or disconnect each of the paths 202 and respective controller bond pads 118 with the core 116. When the switching circuitry 204 electrically connects a path 202 with the core 116, the path 202 may be configured or able to receive memory signals from the core 116 and communicate them to a respective controller bond pad 118, or vice versa. Alternatively, when the switching circuitry 204 electrically disconnects a path 202 with the core 116, the path 202 may not be configured or may be unable communicate memory signals between the core 116 and a respective controller bond pad 118.

In one example configuration, as shown in FIG. 2, the switching circuitry 204 may include an N-number of switches $SW_1$ to $SW_N$ to selectively connect and disconnect the paths $202_1$ to $202_N$ with the core 116. Each of the switches $SW_1$ to $SW_N$ may be in communication with and/or part of a respective path $202_1$ to $202_N$. In addition, each of the switches $SW_1$ to $SW_N$ may be configured to switch between a plurality states or positions. For the configuration shown in FIG. 2, the states may include an open state and a closed state. For each of the switches SW, when the switch SW is closed, the respective path 202 may be connected with the core 116. Alternatively, when the switch SW is open, the respective path 202 may be disconnected with core 116.

In addition, the selection circuitry 124 may include transmitter circuitry 206 integrated with the N-number of paths 202. The transmitter circuitry 206 may be configured to receive the memory signals output by the core 116, generate amplified or charged up versions of the memory signals, and output the amplified or charged up versions to one of the controller bond pads 118. The memory signals received by the transmitter circuitry 206 may have first logic voltage levels, and the amplified or charged up version may be output by the transmitter circuitry at second, different logic voltage levels, as previously described.

In the example configuration shown in FIG. 2, the transmitter circuitry 124 may include an N-number of transmitters $TX_1$ to $TX_N$ configured to output the memory signals to a respective controller bond pad 118. Example circuitry used for the transmitters $TX_1$ to $TX_N$ may include buffers or repeaters, although other types of circuitry to amplify or charge up received signals may additionally or alternatively be used. For some example configurations, the transmitters $TX_1$ to $TX_N$ may be connected to a logic "high" voltage $V_{DDO}$ and a logic "low" voltage $V_{SSO}$. The logic "low" voltage $V_{SSO}$ may be connected to ground for some configurations, as shown in FIG. 2.

Each of the transmitters $TX_1$ to $TX_N$ may be part of or included with a respective path $202_1$ to $202_N$. In addition, inputs for each of the transmitters $TX_1$ to $TX_N$ may be in communication with a respective or associated switch $SW_1$ to $SW_N$. For each transmitter TX, when a respective or associated switch SW is closed, the input of the transmitter TX may be in communication with the core 116 and configured to receive memory signals output from the core 116, and output the received memory signals to a respective controller bond pad 118. Alternatively, when the respective or associated switch SW is open, the input of the transmitter TX may not be in communication with the core 116 and unable to receive the memory signals output from the core 116. When the switch SW is open and the input of the transmitter TX is not in communication with the core 116, the input may be "floating" which in turn configures the transmitter TX in a "floating" state, causing the transmitter TX to apply a high impedance to the respective controller bond pad 118.

The core 116 may be configured to output control signals to the switches $SW_1$ to $SW_N$ to control the states of the switches $SW_1$ to $SW_N$, such as to control whether each of the switches $SW_1$ to $SW_N$ is open or closed. The core 116 may be configured to determine the states for each of the switches $SW_1$ to $SW_N$ based on an identified die 114 to which to send and/or receive memory signals. Upon determining the die 114, the core 114 may determine which of the controller bond pads $118_1$ to $118_N$ is associated with the identified die 114. The core 116 may then determine to output controls signals to close the switch SW associated with and/or that is part of the path 202 connected to the associated controller bond pad 118. The core 116 may also determine to output control signals to open the other switches SW that are not included or part of the path 202 connected to the associated controller bond pad 118, which configures the controller bond pads 118 not associated with the identified die 114 in high impedance or floating states. Then, when the core 116 outputs the memory signals, the memory signals may be sent along the associated path, through the closed switch SW, charged up by the associated transmitter TX, and transmitted to the associated controller bond pad 118, where the memory signals may then be sent across wires 122 to the die bond pads 120 in the group of dies 114 having the identified die 114.

Figure 3:
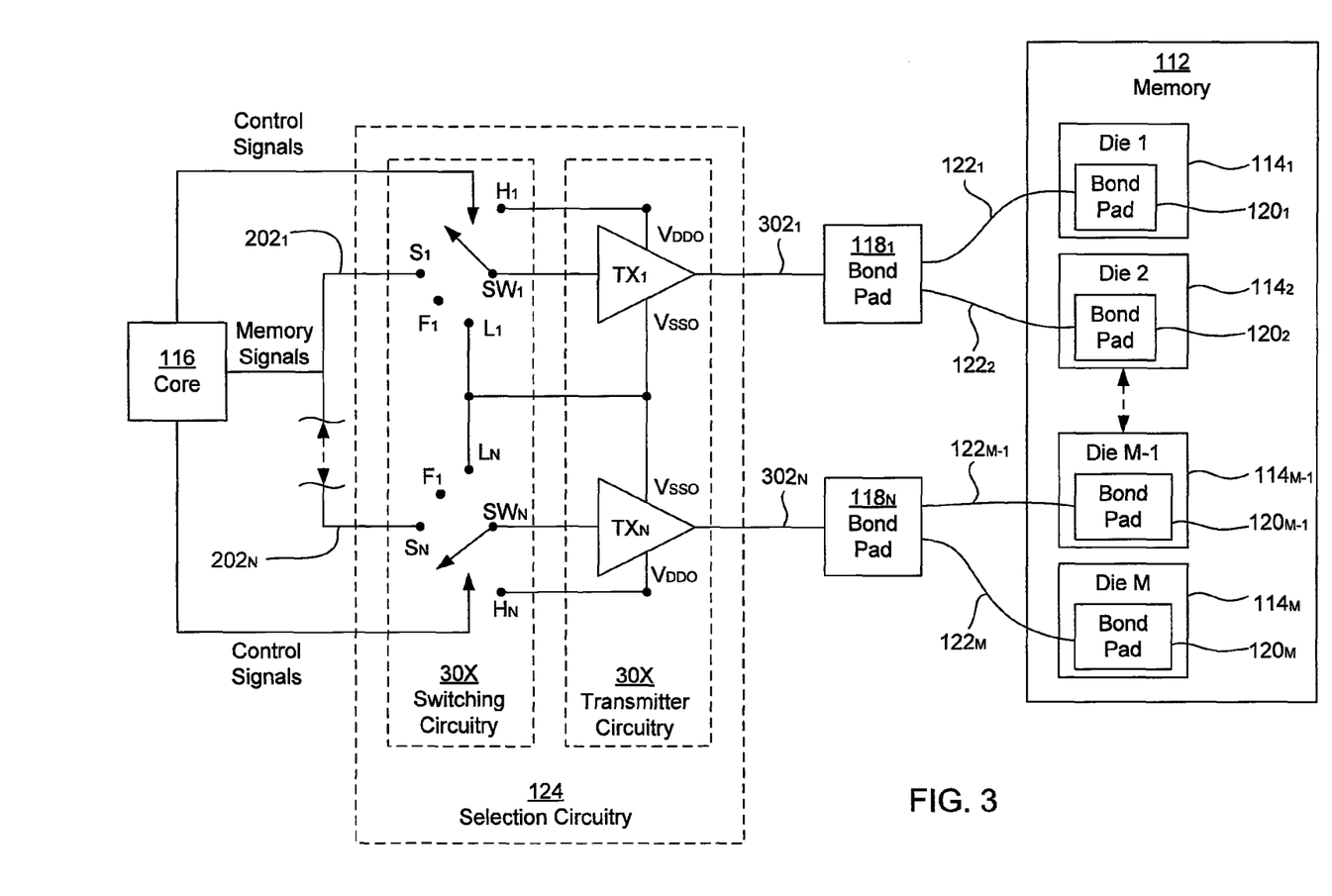
FIG. 3 is a block diagram of the example storage module of FIG. 1, showing an alternative configuration of the selection circuitry.

FIG. 3 shows a circuit schematic diagram of another example configuration of the selection circuitry 124 in communication with the core 116 and the N-number of controller bond pads 118. The configuration shown in FIG. 3 may be similar to the configuration shown in FIG. 2, except that when switches SW in switching circuitry 304 are configured to disconnect associated paths 302 from the core 116, the switches SW may be connected or tied to a logic "high" voltage level or a logic "low" voltage level. As shown in FIG. 3, the logic voltage levels may be the logic "high" voltage level $V_{DDO}$ or the logic "low" voltage level $V_{SSO}$ being applied to the transmitters TX. By configuring the switches SW to be connected to logic "high" or logic "low" voltage levels, the inputs to the associated transmitters TX may be tied to logic level voltages rather than be floating. In turn, the transmitters TX may be configured to output and/or apply steady state voltages at logic "high" or logic "low" levels to respective controller bond pads 118.

In the example configuration shown in FIG. 3, each of the switches $SW_1$ to $SW_N$ may be configured to switch between being configured in four different states. In a first state, each of the switches $SW_1$ to $SW_N$ may be connected to a respective signal terminal $S_1$ to $S_N$, which may electrically connect the input of a respective transmitter TX and controller bond pad 118 to the core 116. In the second state, each of the switches $SW_1$ to $SW_N$ may be connected to a respective logic "high" voltage terminal $H_1$ to $H_N$ connected to the logic "high" voltage $V_{DDO}$, which may tie or connect the input of a respective transmitter TX and controller bond pad 118 to a logic "high" voltage level. In the third state, each of the switches $SW_1$ to $SW_N$ may be connected to a respective logic "low" voltage terminal $L_1$ to $L_N$ connected to the logic "low" voltage $V_{SSO}$, which may tie or connect the input of a respective transmitter TX and controller bond pad 118 to a logic "low" voltage level. In the fourth state, each of the switches $SW_1$ to $SW_N$ may be disconnected from the core 116 and the logic "high" and "low" voltages $V_{DDO}$, $V_{SSO}$ and provide a floating state input (as denoted by floating terminals $F_1$ to $F_N$) for a respective transmitter TX and controller bond pad 118.

In alternative configurations, the switches $SW_1$ to $SW_N$ may be configured to switch between less than all four states. For example, the switches $SW_1$ to $SW_N$ may be configured to switch between only two states, where one of the states is the first state connecting respective transmitters TX and controller bond pads 118 to the core 118, and the other state is the second, third, or fourth state. Alternatively, the switches $SW_1$ to $SW_N$ may be configured switch between only three of the four states, such as the first state and two of the second, third, and fourth states. Various configurations of the switches $SW_1$ to $SW_N$ may be possible, and may depend on whether to tie the controller bond pads 118 to a logic "high" voltage, a logic "low" voltage, or a floating state when they are disconnected from the core 116.

In addition, as previously described, FIGS. 1-3 show a multiple controller bond pad configuration for communication of only a single type of memory signal. Similar or duplicative configurations may be implemented for communication of all or at least more than one of the different types of memory signals. Additionally, while some example embodiments of the controller 110 may use the multiple controller bond pad configuration for communication all of the different types of memory signals, other example embodiments may use the multiple controller bond pad configuration for communication of less than all of the different types of memory signals. In addition or alternatively, the N-number of controller bond pads 118 used for each of the different memory signals may be the same or different among each other. For example, a configuration of the controller 110 may have two controller bond pads for communicating a first type of memory signal, two controller bond pads for communicating a second type of memory signal, a single controller bond pad for communicating a third type of memory signal, and three controller bond pads for communicating a fourth type of memory signal. Various configurations or combinations of configurations with regard to the single and multiple controller bond pad configurations for the different types of memory signals are possible.

In addition, the present description with respect to FIGS. 1-3 describes an example embodiment of a storage module where selection circuitry of a controller that is external to memory dies is configured to selectively couple and decouple bond pads of the controller with the die based on a selection of which memory die a core of the controllers wants to communicate a memory signal with. In alternative embodiments, the selective coupling and decoupling may be controlled by and/or occur on the memory side rather than the controller side. For example, if the first memory die 114₁ wants to communicate a memory signal to a controller bond pad 118 with which the first memory die 114₁ is electrically connected, the memory 112, such as the first memory die 114₁, may be configured to selectively decouple the other memory dies 114 that are also electrically coupled to the controller bond pad 118. In this way, when the first memory die 114₁ sends a memory signal to the controller bond pad 118, less associated bond pad capacitance may be generated, which may reduce overall power consumption during the transmission.

In addition or alternatively, the selective coupling and decoupling as described may be generally implemented or applied for communication between two or more electronic devices, chips, or other circuits that communicate using bond pads and wires and that utilize chip selects or other similar selection schemes to identify or select the devices, chips, circuits, or areas of a device, chip, or circuits, with which they want to communicate.

Figure 4A:
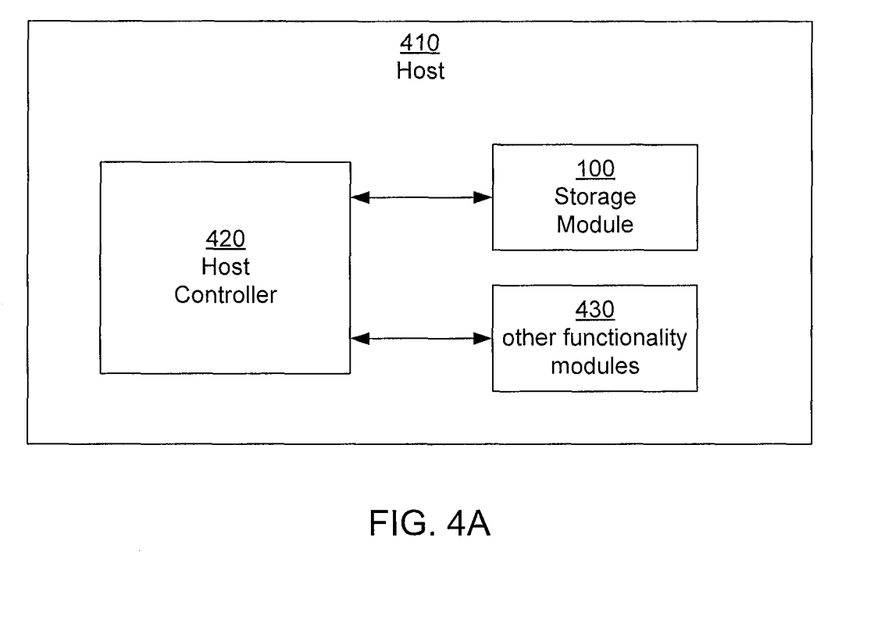
FIG. 4A is a block diagram of the storage module shown in FIG. 1 embedded in a host.
Figure 4B:
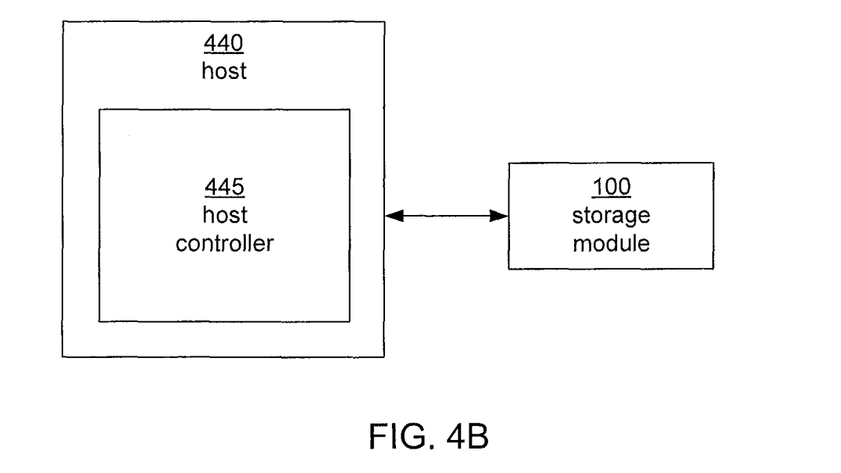
FIG. 4B is a block diagram of the storage module shown in FIG. 1 removably connected with a host.

For some example configurations, the storage module 100 may be implemented with a host by being an embedded device of the host or by being removably connected with a host. FIGS. 4A and 4B show these implementations. As shown in FIG. 4A, the storage module 100 may be embedded in a host 410. In addition to embedding the storage module 100, the host 410 may have a host controller 420. That is, the host 410 may embody the host controller 420 and the storage module 100, such that the host controller 420 interfaces with the embedded storage module 100 to manage its operations. For example, the storage module 100 can take the form of an iNAND™ eSD/eMMC embedded flash drive by SanDisk Corporation. The host controller 420 may interface with the embedded storage module 100 using the host interface 116 (FIG. 1). Additionally, when the storage module 100 is embedded in the host 410, some or all of the functions performed by the controller 110 in the storage module 100 may instead be performed by the host controller 420.

The host 410 can take any form, such as, but not limited to, a solid state drive (SSD), a hybrid storage module (having both a hard disk drive and a solid state drive), a memory caching system, a mobile phone, a tablet computer, a digital media player, a game device, a personal digital assistant (PDA), a mobile (e.g., notebook, laptop) personal computer (PC), or a book reader, as examples. As shown in FIG. 4A, the host 410 can include optional other functionality modules 430. For example, if the host 410 is a mobile phone, the other functionality modules 430 can include hardware and/or software components to make and place telephone calls. As another example, if the host 410 has network connectivity capabilities, the other functionality modules 430 can include a network interface. These are just some examples, and other implementations can be used. Also, the host 410 can include other components (e.g., an audio output, input-output ports, etc.) that are not shown in FIG. 4A to simplify the drawing.

As shown in FIG. 4B, instead of being an embedded device in a host, the storage module 100 may have physical and electrical connectors that allow the storage module 100 to be removably connected to a host 440 (having a host controller 445) via mating connectors. As such, the storage module 100 may be a separate device from (and is not embedded in) the host 440. In this example, the storage module 100 can be a removable memory device, such as a Secure Digital (SD) memory card, a microSD memory card, a Compact Flash (CF) memory card, or a universal serial bus (USB) device (with a USB interface to the host), and the host 440 is a separate device, such as a mobile phone, a tablet computer, a digital media player, a game device, a personal digital assistant (PDA), a mobile (e.g., notebook, laptop) personal computer (PC), or a book reader, for example.

Figure 5:
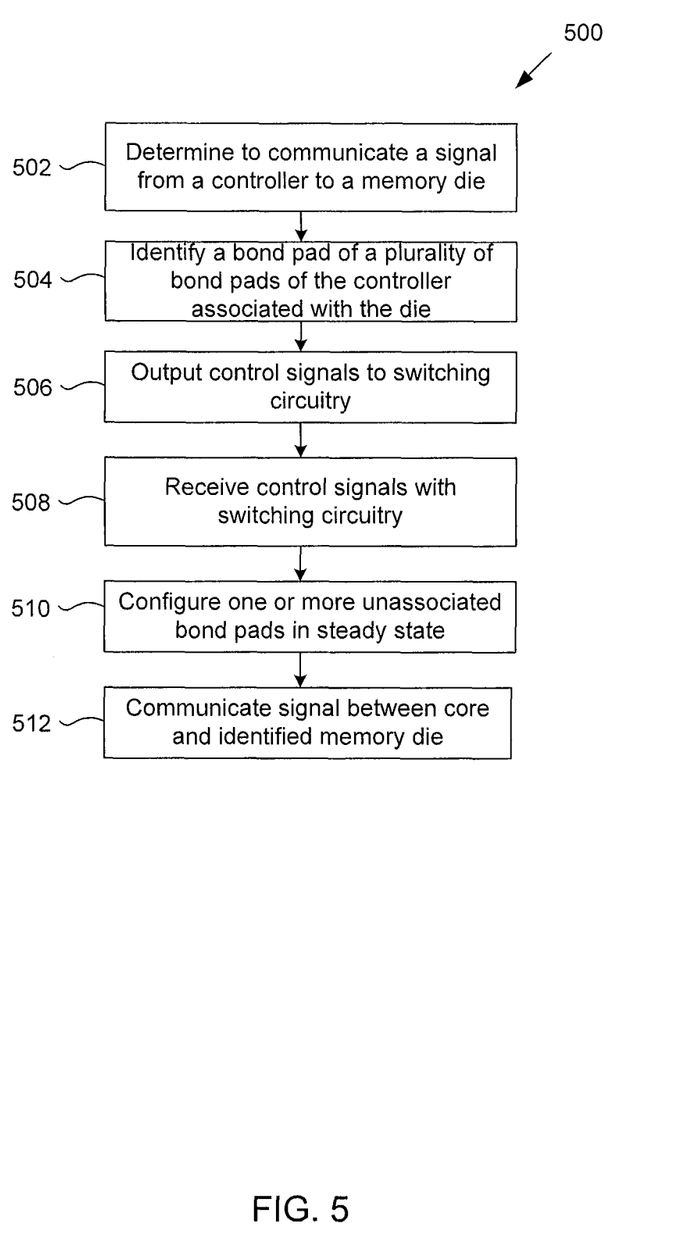
FIG. 5 is a flow chart of a method of communicating signals from an external controller to multiple memory dies using multiple bond pads.

FIG. 5 shows a flow chart of an example method 500 of communicating signals between multiple bond pads of a controller and multiple dies of memory in a storage module. At block 502, a core of the controller may determine to communicate, including determining to send or receive, a signal, such as a data signal, a command signal, or other signal with one of the multiple dies. The determination may include selecting or identifying which of one of the dies to communicate the signal. At block 504, the core may identify a bond pad of a plurality of bond pads of the controller that is associated and/or electrically connected with the die identified at block 502. The bond pad may identify the bond pad through decoding, performing a table look up or accessing a mapping scheme that associates each of the multiple dies in the memory with one of the bond pads, as previously described.

At block 506, the core may generate and output control signals to switching circuitry positioned in between the core and the bond pads of the controller. The control signals may configure the switching circuitry to electrically connect the bond pad identified at block 504 with the core and to electrically disconnect or isolate the one or more bond pads of the controller not identified at block 504 from the core. In this way, when the signal is communicated, the identified bond pad may receive the signal and the one or more other bond pads may not receive the signal. The switching signals may also configure the switching circuitry to be configured to electrically place and/or maintain the one or more other bond pads in a steady state, such as by applying a logic "high" voltage, a logic "low" voltage, or configuring them in a high-impedance or floating state.

At block 508, the switching circuitry may receive the control signals output from the core and be configured in accordance with the control signals. For some example methods, upon receiving the controls signals, switches in the switching circuitry may switch between and/or be configured in one of a plurality of different states to electrically connect or disconnect the core with paths that are coupled to respective bond pads. For example, the control signals may configure a switch in a first state, such as a closed state, to electrically connect the core with the bond pad identified at block 504 and configure the one or more other switches in a second state, such as an open state, to electrically disconnect the core from the other bond pads not identified at block 504. In addition or alternatively, when switched in the second state, the one or more other switches may be tied or connected to a steady state voltage, such as a logic "high" voltage, a logic "low" voltage, or unconnected in a floating state (high impedance).

At block 510, the other bond pads not identified at block 504 may be configured and/or maintained in a steady state. For example, steady state voltages may be applied to inputs of transmitters having outputs coupled to the other bond pads, and amplified or charged up steady state voltages output by the transmitters may be applied to the other bond pads. When the steady state voltage is applied to the other bond pads, the other bond pads may not toggle or oscillate between logic "high" and logic "low" voltage levels like the identified bond pad when the identified bond pad receives the signal being communicated with the core and the memory die identified at block 502.

At block 512, the signal may be communicated between the core and the die identified at block 502 via the bond pad identified at block 504. The signal may be communicated over one or more wires connecting the identified bond pad of the controller with bond pads or pins of one or more dies that are part of a group or set of dies. The signal may be communicated over identified bond pad and the one or more wires while the other bond pads are being maintained in the steady state. One of the dies in the group may include the die identified at block 502. In addition, the group may include less than all of the dies that make up the memory of the storage module. In this way, a lesser amount of bond pad capacitance may be generated between the bond pad identified at block 504 and the bond pads of the memory dies in the group associated with the identified bond pad, which may reduce overall power consumption when communicating the signal. In addition, at block 512, the signal may be communicated along a path of the controller that couples the bond pad identified at block 504 with the core. In some methods, the signal may pass through a closed switch that electrically couples the identified bond pad and the core. Where the signal is transmitted by the core, the signal may be received by an input of a transmitter, where the signal may be amplified or pumped with charge, and then output by the transmitter to the identified bond pad before it is communicated to the group or set of dies.

It is intended that the foregoing detailed description be understood as an illustration of selected forms that the embodiments can take and does not intend to limit the claims that follow. Also, some of the following claims may state that a component is operative to perform a certain function or configured for a certain task. It should be noted that these are not restrictive limitations. It should also be noted that the acts recited in the claims can be performed in any order—not necessarily in the order in which they are recited. Additionally, any aspect of any of the preferred embodiments described herein can be used alone or in combination with one another. In sum, although the present invention has been described in considerable detail with reference to certain embodiments thereof, other versions are possible. Therefore, the spirit and scope of the appended claims should not be limited to the description of the embodiments contained herein.

I claim:

1. An electronic device comprising:
a first circuit comprising a plurality of first circuit bond pads configured to communicate a same type of signal;
a second circuit comprising:
a plurality of second circuit bond pads configured to communicate the same type of signal with the plurality of first bond pads of the first circuit, wherein each of the first circuit bond pads is electrically connected to at least one and less than all of the plurality of second circuit bond pads; and
a plurality of areas, each of the plurality of areas comprising one of the plurality of second circuit bond pads; and
switching circuitry,
wherein the first circuit further comprises a core in selective communication with the plurality of first circuit bond pads, the core configured to determine to communicate a signal of the same type to an identified area of the plurality of areas, and send one or more control signals to the switching circuitry based on the determination, and
wherein the switching circuitry, responsive to the one or more control signals, is configured to be in a predetermined state to electrically connect the core with an associated first circuit bond pad that is electrically connected with the identified area, and electrically disconnect one or more unassociated first circuit bond pads of the plurality of first circuit bond pads with the core, the one or more unassociated first circuit bond pads being electrically unconnected to the identified area.

2. The electronic device of claim 1, wherein the core is further configured to
determine which of the plurality of first circuit bond pads to communicate the signal.

3. The electronic device of claim 1, further comprising transmitter circuitry configured to:
when the switching circuitry is in the predetermined state:
transmit the signal to the associated first circuit bond pad; and maintain the one or more unassociated first circuit bond pads in a steady state.

4. The electronic device of claim 3, wherein the switching circuitry, in the predetermined state, is further configured to:
communicate the signal to a first transmitter of the transmitter circuitry for transmission of the signal to the associated first circuit bond pad; and
provide a steady state input to one or more second transmitters of the transmitter circuitry to maintain the one or more unassociated first circuit bond pads in the steady state.

5. The electronic device of claim 3, wherein the transmitter circuitry, to maintain the one or more unassociated first circuit bond pads in the steady state, is configured to apply a steady state voltage to the one or more unassociated first circuit bond pads or configure the one or more unassociated first circuit bond pads in a high impedance state.

6. The electronic device of claim 5, wherein the steady state voltage comprises a voltage being applied to the transmitter circuitry to power the transmitter circuitry.

7. The electronic device of claim 1, wherein the plurality of first circuit bond pads and the plurality of second circuit bond pads are configured to communicate with each other via bond wires.

8. The electronic device of claim 1, wherein the plurality of areas comprises a plurality of chips.

9. An electronic device comprising:
a first circuit comprising a plurality of first circuit bond pads configured to communicate a same type of signal; and
a second circuit comprising a plurality of second circuit bond pads configured to communicate the same type of signal with the plurality of first bond pads of the first circuit,
wherein each of the first circuit bond pads is electrically connected to at least one and less than all of the plurality of second circuit bond pads,
wherein the second circuit comprises a memory comprising a plurality of memory dies, wherein each of the plurality of memory dies comprises one of the plurality of second circuit bond pads, and
wherein the first circuit comprises a controller configured to communicate with the memory to perform memory operations.

10. A method comprising:
determining, with a core of a first circuit, to communicate a signal with a second circuit, the signal being a predetermined type;
identifying, with the core, a first area from among a plurality of areas of the second circuit with which to communicate the signal;
identifying, with the core, an associated first circuit bond pad from among a plurality of first circuit bond pads of the first circuit with which to communicate the signal, wherein the plurality of first circuit bond pads are configured to communicate signals being the predetermined type with the plurality of areas of the second circuit, wherein each of the plurality of first circuit bond pads is electrically connected to at least one and less than all of the plurality of areas, and wherein the associated first circuit bond pad is electrically connected to the first area;
configuring selection circuitry in a predetermined state to electrically connect the associated first circuit bond pad to the core and electrically disconnect one or more unassociated first circuit bond pads of the plurality of first circuit bond pads, the one or more unassociated first circuit bond pads not identified by the core with which to communicate the signal; and
communicating the signal between the core and the first area via the associated first circuit bond pad.

11. The method of claim 10, further comprising:
sending, with the core, one or more control signals to the selection circuitry to configure the selection circuitry in the predetermined state.

12. The method of claim 11, further comprising:
when the selection circuitry is in the predetermined state:
communicating, with the selection circuitry, the signal between the core and the associated first circuit bond pad; and
maintaining, with the selection circuitry, the one or more unassociated first circuit bond pads in a steady state.

13. The method of claim 12, wherein maintaining the one or more unassociated first circuit bond pads in a steady state comprises:
maintaining, with the selection circuitry, the one or more unassociated first circuit bond pads in the steady state while communicating the signal between the core and the associated first circuit bond pad.

14. The method of claim 12, wherein maintaining the one or more unassociated first circuit bond pads in the steady state comprises:
applying, with the selection circuitry, a steady state voltage to the one or more unassociated first circuit bond pads; or
configuring, with the selection circuitry, the one or more unassociated first circuit bond pads in a floating state.

15. A storage device comprising:
a controller configured to communicate with a memory comprising a plurality of memory dies, the controller comprising:
a plurality of controller bond pads configured to communicate a same type of memory signal with a plurality of die bond pads of the plurality of memory dies, each of the plurality of controller bond pads being electrically connected to at least one and less than all of the plurality of die bond pads; and
a core configured to:
determine to communicate a memory signal with a memory die of the plurality of memory dies, the memory signal being the same type;
identify a controller bond pad from among the plurality of controller bond pads via which to communicate the memory signal with the memory die based on the determination;
send one or more control signals to selection circuitry that configures the selection circuitry in a predetermined state, wherein, when the selection circuitry is configured in the predetermined state, the selection circuitry electrically connects the identified controller bond pad to the core and electrically disconnects one or more unassociated controller bond pads of the plurality of controller bond pads from the core; and
communicate the memory signal with the identified controller bond pad.

16. The storage device of claim 15, wherein the one or more control signals further configures the selection circuitry in the predetermined state such that, in the predetermined state, the selection circuitry configures the one or more unassociated controller bond pads in a steady state.

17. An electronic device comprising:
a first circuit comprising a plurality of first circuit bond pads configured to communicate a same type of signal;
a second circuit comprising: a plurality of second circuit bond pads configured to communicate the same type of signal with the plurality of first bond pads of the first circuit, wherein each of the first circuit bond pads is electrically connected to at least one and less than all of the plurality of second circuit bond pads; and a plurality of areas, each of the plurality of areas comprising one of the plurality of second circuit bond pads;
means for identifying an area of the plurality of areas to which to send a signal;
means for configuring selection circuitry in a predetermined state in response to the area being identified, wherein the predetermined state electrically connects the means for identifying to an associated first circuit bond pad that is electrically connected to a second circuit bond pad of the area, and electrically disconnects the means for identifying with an unassociated first circuit bond pad that is electrically unconnected with the second circuit bond pad of the area; and
means for communicating the signal to the area.

18. The electronic device of claim 17, further comprising:
means for sending one or more control signals to the means for configuring selection circuitry to configure the selection circuitry in the predetermined state.

19. The electronic device of claim 17, further comprising:
means for maintaining the unassociated first circuit bond pad in a steady state when the selection circuitry is in the predetermined state,
wherein the means for communicating the signal comprises the selection circuitry configured to communicate the signal between the means for identifying and the associated first circuit bond pad when the selection circuitry is in the predetermined state.

20. The electronic device of claim 19, wherein the means for maintaining comprises means for applying a steady state voltage to the unassociated first circuit bond pad.

21. The electronic device of claim 19, wherein the means for maintaining comprises means for configuring the unassociated first circuit bond pad in a floating state.

* * * * *